United States Patent [19]
Hisamoto et al.

[11] Patent Number: 5,246,877
[45] Date of Patent: Sep. 21, 1993

[54] METHOD OF MANUFACTURING A SEMICONDUCTOR DEVICE HAVING A POLYCRYSTALLINE ELECTRODE REGION

[75] Inventors: Yoshiaki Hisamoto; Hiroshi Yamaguchi, both of Itami, Japan

[73] Assignee: Mitsubishi Denki Kabushiki Kaisha, Tokyo, Japan

[21] Appl. No.: 652,221

[22] Filed: Feb. 6, 1991

Related U.S. Application Data

[62] Division of Ser. No. 362,350, Jun. 6, 1989, abandoned.

[30] Foreign Application Priority Data

Jan. 31, 1989 [JP] Japan .................................... 1-21684

[51] Int. Cl.⁵ ............................................ H01L 21/76
[52] U.S. Cl. ........................................ 437/62; 437/162; 437/203; 437/86
[58] Field of Search ............... 357/49, 30, 50, 59, 357/60, 47; 437/62, 162, 186, 203, 233, 86; 148/DIG. 37, DIG. 123

[56] References Cited

U.S. PATENT DOCUMENTS

| | | | |
|---|---|---|---|
| H763 | 4/1990 | Feygenson | 357/59 |
| 3,381,182 | 4/1968 | Thornton | 357/59 |
| 3,475,661 | 10/1969 | Saburo Iwata et al. | 357/59 |
| 3,509,433 | 4/1970 | Schroeder | 357/49 |
| 3,722,079 | 3/1973 | Beasom | 29/578 |
| 3,858,237 | 12/1974 | Sawazaki et al. | 357/49 |
| 3,881,242 | 5/1975 | Nuttall et al. | 29/589 |
| 4,124,934 | 11/1978 | Debrébisson | 437/162 |
| 4,692,784 | 9/1987 | Negoro | 357/49 |
| 4,807,012 | 2/1989 | Beasom | 357/49 |

FOREIGN PATENT DOCUMENTS

| | | | |
|---|---|---|---|
| 81030704 | 7/1981 | Japan | 437/162 |
| 58-21820 | 2/1983 | Japan | 437/162 |
| 60-120974 | 9/1985 | Japan | 437/162 |

OTHER PUBLICATIONS

Middlehoek, J., "Polycrystalline Silicon as a Diffusion Source..." *IEEE J. of Solid State Circuits*, vol. SC-12, No. 2, Apr. 1977, pp. 135-138.

Primary Examiner—George Fourson
Attorney, Agent, or Firm—Oblon, Spivak, McClelland, Maier & Neustadt 5 Claims, 8 Drawing Sheets :
METHOD OF MANUFACTURING A SEMICONDUCTOR DEVICE HAVING A POLYCRYSTALLINE ELECTRODE REGION This application is a division of application Ser. No. 07/362,350 filed on Jun. 6, 1989, now abandoned.

BACKGROUND OF THE INVENTION

1. Field of the Invention

The present invention relates to a semiconductor device having electrode regions of high concentration and a method of manufacturing the same.

2. Description of the Background Art

FIG. 1 is a sectional view showing a conventional semiconductor device of isolated type composite element structure. As shown in FIG. 1, an insulated gate field-effect transistor 10A and a junction bipolar transistor 10B are formed in an upper layer part of an $n^-$-type polysilicon substrate 1 to be insulated/isolated by insulating films 2. $N^+$-type layers 3 of prescribed thickness are formed on the insulating films 2, and $n^-$-type layers 4 are formed on the $n^+$-type layers 3.

In an element forming region (hereinafter referred to as "island") provided with the field-effect transistor 10A, a p-type well region 5 is formed in an upper layer part of the $n^-$-type layer 4, while $n^+$-type source regions 6 are selectively formed on the surface part of the p-type well region 5.

Polysilicon gates 8 are formed on surface parts of the p-type well region 5 held between the surfaces of the $n^-$-type layer 4 and the source regions 6 through a gate oxide film 7. Drain electrodes 9 are formed on the surface of the $n^+$-type layer 3, and a source electrode 11 is formed over a part of the surface of the $n^+$-type source regions 6 and a part of the surface of the p-type well region 5 held between the $n^+$-type source regions 6, while gate electrodes 12 are formed on the polysilicon gates 8. The electrodes 9, 11 and 12 are insulated from each other by passivation films 18.

In another island provided with the bipolar transistor 10B on the other hand, a p-type base region 13 is formed in an upper layer part of the $n^-$-type layer 4. An $n^+$-type emitter region 14 is formed in a part of the surface of the p-type base region 13. An emitter electrode 15 is formed on the $n^+$-type emitter region 14 and a base electrode 16 is formed on the p-type base region 13, while a collector electrode 17 is formed on the $n^+$-type layer 3. The electrodes 15 to 17 are insulated from each other by passivation films 18.

FIGS. 2A to 2G are sectional views showing a method of forming the islands in the semiconductor device shown in FIG. 1. This method will now be described with reference to these figures.

A resist film 22 is formed on the surface of a monocrystal $n^-$-type substrate 21 as shown in FIG. 2A, and patterned as shown in FIG. 2B. The patterned resist film 22 serves as a mask to etch the $n^-$-type substrate 21, thereby to define V-shaped cavities 23 as shown in FIG. 2C. An interval 1 between each pair of adjacent cavities 23 defines the width of each island.

Then, an n-type impurity such as phosphorus is diffused on the surface of the $n^-$-type substrate 2 including the cavities 23, to form an $n^+$-type layer 3. Pretreatment (removal of a phosphorus glass layer etc. formed on the $n^+$-type layer 3) is performed through hydrofluoric acid system chemicals, and thereafter an insulating film 2 such as a thermal oxidation film is formed on the $n^+$-type layer 3, as shown in FIG. 2D.

An $n^-$-type polysilicon layer 24 is formed on the insulating film 3 through epitaxial growth technique, as shown in FIG. 2E. Then, the rear surface of the $n^-$-type substrate 21 is polished, to expose the insulating film 2 and the $n^+$-type layer 3 on the rear surface of the $n^-$-type substrate 21, as shown in FIG. 2F.

Then, the $n^-$-type substrate 21 is so turned over as to complete a plurality of islands 25, in which the $n^-$-type polysilicon layer 24 corresponds to the $n^-$-type polysilicon substrate shown in FIG. 1 and the remaining $n^-$-type substrate 21 corresponds to the $n^-$-type layers 4 shown in FIG. 1 while the respective islands 25 are insulated by the insulating films 2, as shown in FIG. 2G. The field-effect transistor 10A and the bipolar transistor 10B are manufactured in the respective islands 25 thus obtained.

The $n^+$-type layers 3, which are brought into ohmic contact with the drain electrodes 9 and the collector electrode 17, respectively, must be increased in thickness as well as in concentration in order to minimize ON resistance and drain-to-source forward voltage in the field-effect transistor 10A and to minimize collector-to-emitter saturation voltage in the bipolar transistor 10B.

However, it is extremely difficult to form thick $n^+$-type layers 3 of high concentration by an impurity diffusion method, since the processing takes too much time to degrade workability and since the value of concentration which can be realized through diffusion is limited to about $10^{18}$ to $10^{19}$ cm$^{-3}$.

SUMMARY OF THE INVENTION

In the first aspect of the present invention, a semiconductor device comprises a semiconductor substrate, at least one active region formed on the semiconductor substrate, and an electrode region formed in the active region, the electrode region comprising a polycrystalline semiconductor layer containing an impurity of a prescribed conductivity type in high concentration and a diffusion layer of the prescribed conductivity type formed in a periphery of the polycrystalline semiconductor layer.

In the second aspect of the present invention, a method of manufacturing a semiconductor device comprises the steps of preparing a semiconductor substrate, forming an active region on the semiconductor substrate, forming a polycrystalline semiconductor layer containing a prescribed conductivity type impurity in high concentration in the active region, and diffusing the prescribed conductivity type impurity from the polycrystalline semiconductor layer serving as a diffusion source to form a diffusion layer in a periphery of the polycrystalline semiconductor layer, the diffusion layer together with the polycrystalline semiconductor layer defining an electrode region.

According to the present invention, an electrode region is defined by a polycrystalline semiconductor layer, which is formed in an active region and contains a prescribed conductivity type impurity in high concentration, and a diffusion layer which can be formed by diffusion from the polycrystalline semiconductor layer by using the polycrystalline semiconductor layer as a diffusion source, whereby the electrode region can be formed in high workability, high concentration and wide thickness.

Accordingly, an object of the present invention is to provide a semiconductor device having an electrode region of high concentration in desired thickness, and a method of manufacturing the same.

DESCRIPTION OF THE PREFERRED EMBODIMENT

Figure 1:
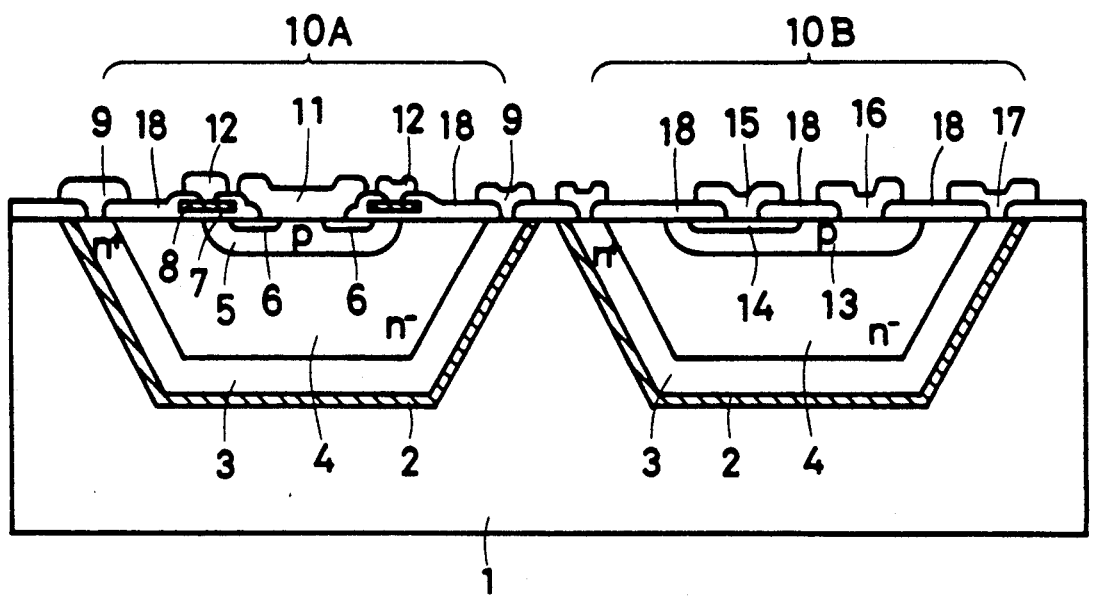
FIG. 1 is a sectional view showing a conventional semiconductor device of isolated type composite element structure.
Figure 2A:
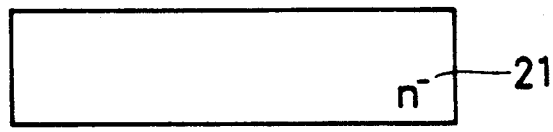
FIGS. 2A to 2G are sectional views showing a method of manufacturing the semiconductor device shown in FIG. 1.
Figure 2B:
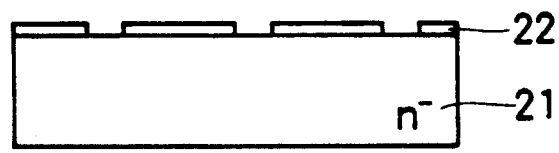
Figure 2C:
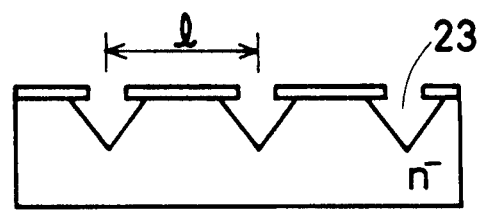
Figure 2D:
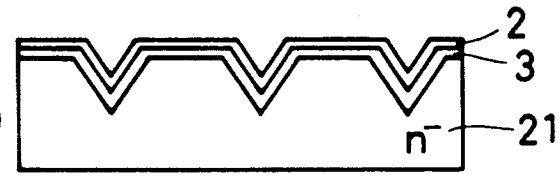
Figure 2E:
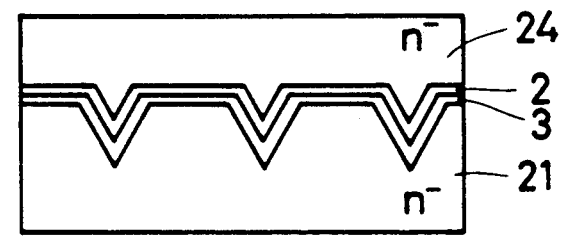
Figure 2F:
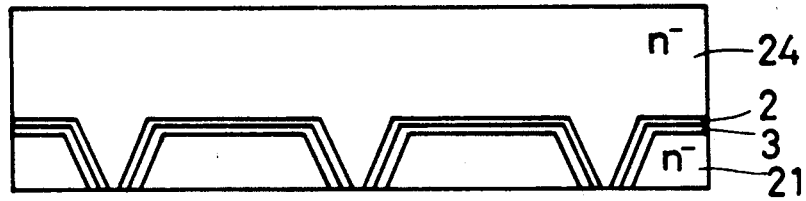
Figure 2G:
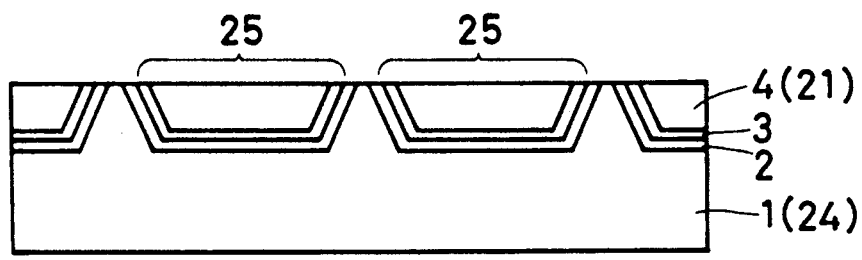
Figure 3:
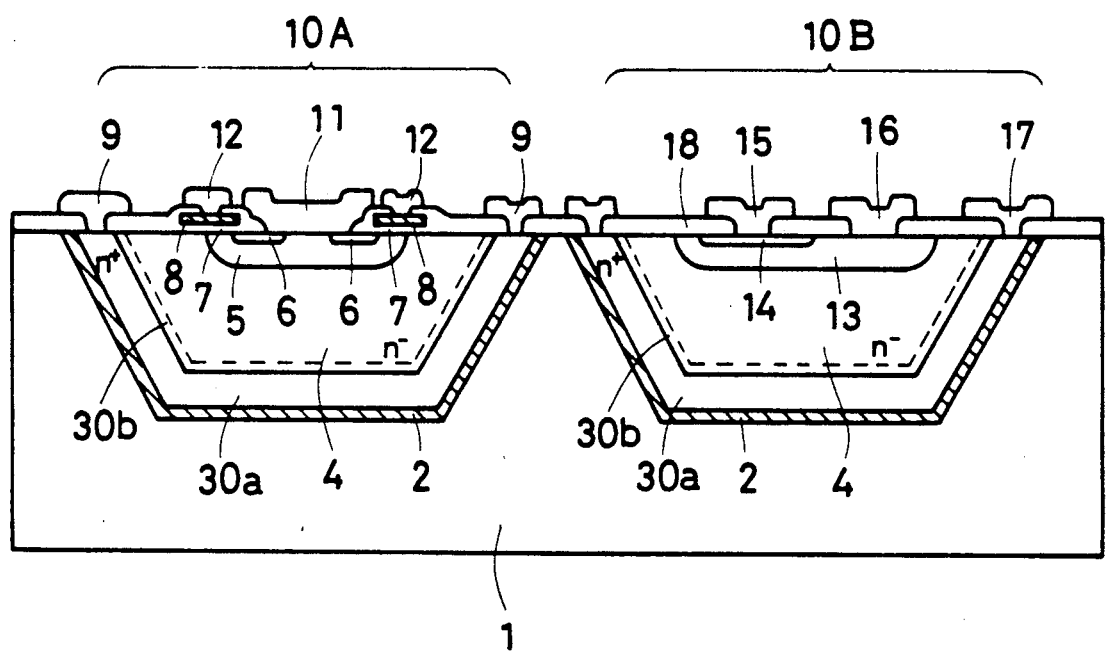
FIG. 3 is a sectional view showing an embodiment of a semiconductor device of isolated type composite element structure according to the present invention.

FIG. 3 is a sectional view showing a semiconductor device of isolated type composite element structure according to an embodiment of the present invention. As shown in FIG. 3, this semiconductor device of the embodiment is provided with polysilicon layers 30a containing an n-type impurity in high concentration and n+-type diffusion layers 30b obtained by impurity diffusion from the polysilicon layers 30a serving as diffusion sources, in place of the n+-type layers 3 formed on the insulating films 2 in prescribed thickness in the conventional device shown in FIG. 1. Other structure of this embodiment is identical to that shown in FIG. 1, and hence redundant description about that will be omitted.

FIGS. 4A to 4G are sectional views showing a method of forming islands in the semiconductor device shown in FIG. 3. This method will now be described below with reference to these figures.

Figure 4A:
FIGS. 4A to 4G are sectional views showing a method of manufacturing the semiconductor device shown in FIG. 3.
Figure 4B:
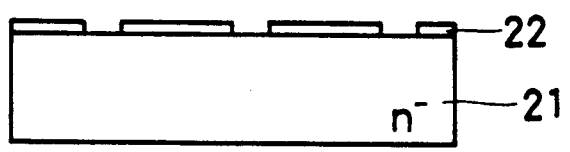
Figure 4C:
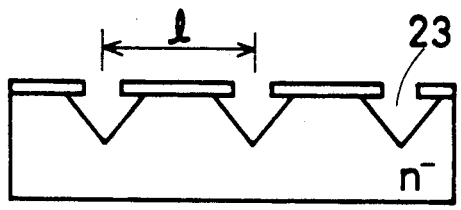

A resist film 22 is formed on the surface of a monocrystal n⁻-type substrate 21 as shown in FIG. 4A, and patterned as shown in FIG. 4B. The patterned resist film 22 serves as a mask to etch the n⁻-type substrate 21, thereby to define V-shaped cavities 23 as shown in FIG. 4C. An interval 1 between each pair of adjacent cavities 23 define the width of each island.

Figure 4D:
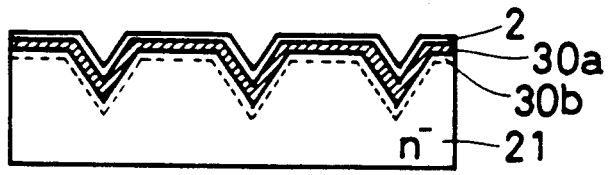

Then, polysilicon layer 30a containing an n-type impurity in high concentration is formed on the surface of the n⁻-type substrate 21 including the cavities 23 in thickness of tens of microns. Thereafter the substrate 21 is continuously introduced into an insulating film forming furnace, thereby to form an insulating film 2 on the polysilicon layer 30a in thickness of several microns. At the same time, an n+-type diffusion layer 30b is formed in a portion of the n⁻-type substrate 21 on the periphery of the polysilicon layer 30a by thermal diffusion of the impurity contained in the polysilicon layer 30a, as shown in FIG. 4D.

Figure 4E:
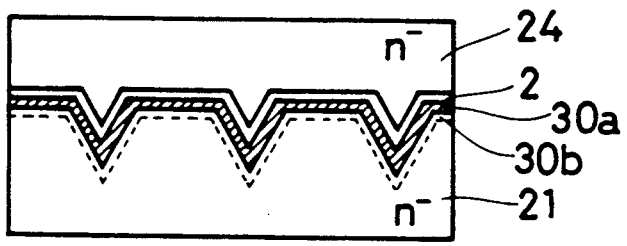
Figure 4F:
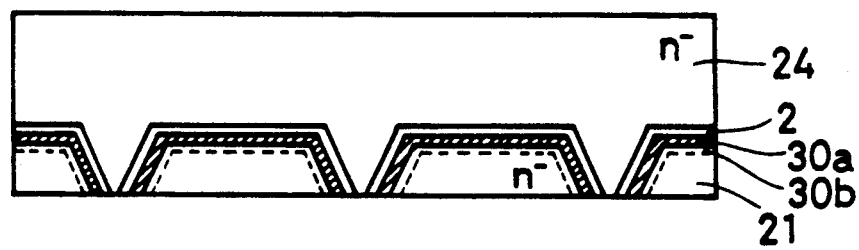
Figure 4G:
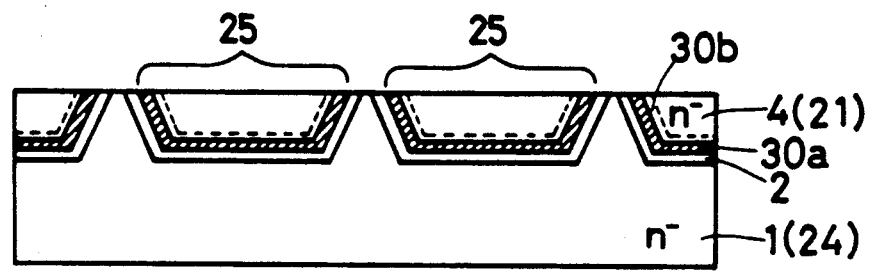

An n⁻-type polysilicon layer 24 is formed on the insulating film 2 by epitaxial growth technique, as shown in FIG. 4E. Then, the rear surface of the n⁻-type substrate 21 is polished to expose the insulating film 2, the polysilicon layer 30a and the n+-type diffusion layer 30b on the rear surface of the n⁻-type substrate 21, as shown in FIG. 4F.

The n⁻-type substrate 21 is so turned over as to complete a plurality of islands 25, in which the n⁻-type polysilicon layer 24 corresponds to the n⁻-type polysilicon substrate 1 shown in FIG. 3 and the remaining n⁻-type substrate 21 corresponds to the n⁻-type layers 4 shown in FIG. 3 while the respective islands 25 are insulated by the insulating films 2.

A field-effect transistor 10A and a bipolar transistor 10B are manufactured in the islands 25 thus obtained, through the following steps: FIGS. 5A to 5D are sectional views showing a method of manufacturing the field-effect transistor 10A and the bipolar transistor 10B. This manufacturing method will now be described below with reference to these figures.

Figure 5A:
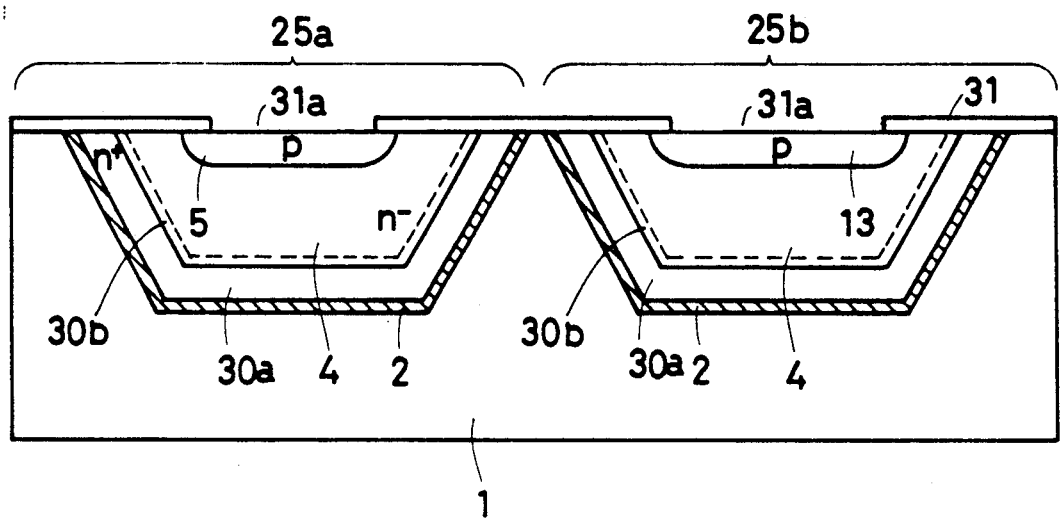
FIGS. 5A to 5D are sectional views showing a method of manufacturing a field-effect transistor and a bipolar transistor

First, the n⁻-type polysilicon substrate 1 is pretreated with hydrofluoric acid system chemicals. Then, an oxide film 31 is formed on the surface of the n⁻-type polysilicon substrate by thermal oxidation or the like, and the oxide film 31 is selectively patterned by photolithography to define windows 31a. Then, an impurity is diffused from the windows 31a of the oxide film 31, to form a p-type well region 5 in an upper layer part of an n⁻-type layer 4 in an island 25a and a p-type base region 13 in an upper layer part of an n⁻-type layer 4 in an island 25b, as shown in FIG. 5A.

Figure 5B:
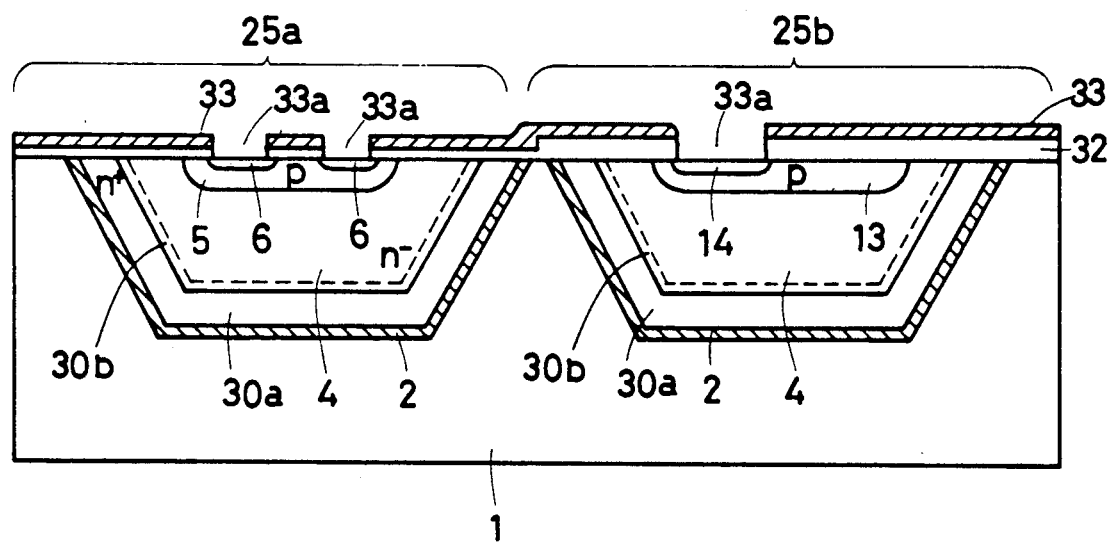

Then, the oxide film 31 is removed from the island 25a and a thin oxide film 32 is formed on the surface of the n⁻-type epitaxial substrate 1 by thermal oxidation or the like. A polysilicon layer 33 is formed on the oxide film 32. The oxide film 32 is coalesced with the oxide film 31 on the island 25b, to be slightly increased in thickness. Then, the polysilicon layer 33 and the oxide film 32 are selectively etched to define windows 33a. An n-type impurity is diffused from the windows 33a of the polysilicon layer 33 to form n+-type source regions 6 and an n+-type emitter region 14 in upper layer parts of the p-type well region 5 and the p-type base region 13, respectively, as shown in FIG. 5B. If the field-effect transistor 10A is of a double diffusion type, a p-type impurity may be diffused from the windows 33a before formation of the n+-type source regions 6.

Figure 5C:
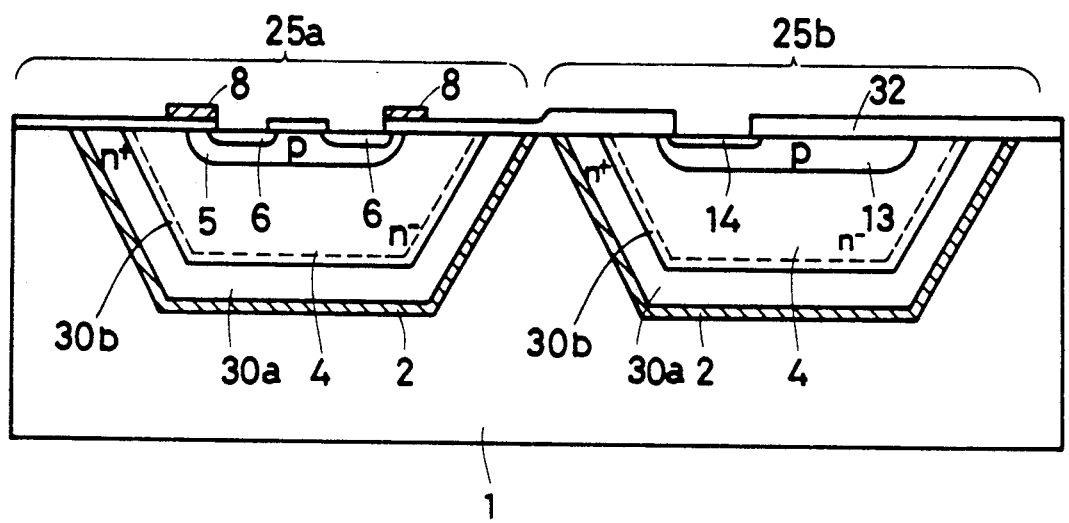
Figure 5D:
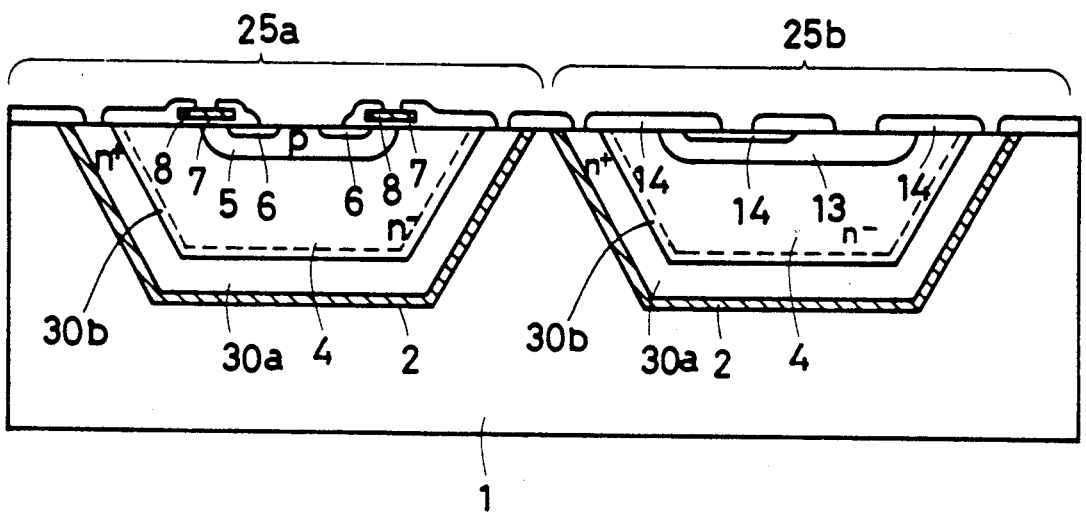

Thereafter the polysilicon layer 33 is selectively etched to form polysilicon gates 8 on the island 25a, as shown in FIG. 5C. Then, an oxide film is formed over the entire surface of the n⁻-type epitaxial substrate 1 and selectively etched, thereby to form passivation films 18 in the islands 25a and 25b, as shown in FIG. 5D.

Thereafter a conductive layer is formed on the n⁻-type epitaxial substrate 1 including the passivation films 18 and selectively etched, thereby to define drain electrodes 9, a source electrode 11 and gate electrodes 12 in the island 25a and an emitter electrode 15, a base electrode 16 and a collector electrode 17 in the island 25b, as shown in FIG. 3. Thus, the field-effect transistor 10A is formed in the island 25a and the bipolar transistor 10B is formed in the island 25b.

In the aforementioned embodiment, the n+-type regions for serving as electrode regions in the islands 25 are formed by the polysilicon layers 30a doped with an n-type impurity in high concentration and the n+-type diffusion layers 30b obtained by diffusion of the impurity from the polysilicon layers 30a. Impurity concentration of the polysilicon layers 30a can be easily and correctly increased to about $10^{19}$ to $10^{20}$ cm$^{-3}$. N+-type layers of 20 μm in thickness can be formed in a short time of about 20 minutes by means of formation of the polysilicon layers 30a although about four hours have been required in the conventional impurity diffusion method. Therefore, the film thickness can be increased in a short time. Thus, n+-type layers of high concentration can be formed in the islands 25 in desired thickness with good workability.

When the field-effect transistor 10A is manufactured in the island 25, ON resistance and drain-to-source forward voltage can be minimized by bringing the polysilicon layer 30a and the diffusion layer 30b into ohmic contact with the drain electrodes 9, while collector-to-emitter saturation voltage can be minimized when the bipolar transistor 10B is manufactured in the island 25, by bringing the polysilicon layer 30a and the diffusion layer 30b into ohmic contact with the collector electrode 17.

Further, the n+-type diffusion layers 30b are simultaneously formed with the insulating films 2, whereby the manufacturing steps are not increased as compared with the prior art.

Although the above embodiment has been described with reference to a semiconductor device of isolated type composite element structure, the present invention is also applicable to all types of semiconductor devices which require an electrode region of high concentration in desired thickness in active regions of semiconductor elements.

What is claimed is:

1. A method of fabricating a semiconductor device, comprising the steps of:

forming a plurality of grooves on a first major surface of a semiconductor substrate to define a semiconductor element forming region between each adjacent pair of said grooves;

forming a polycrystalline semiconductor layer containing a first conductivity type impurity in said semiconductor element forming region on said first major surface of said semiconductor substrate including said grooves, said polycrystalline semiconductor layer being higher in impurity concentration than said semiconductor substrate;

forming a dielectric layer on said polycrystalline semiconductor layer;

diffusing said first conductivity type impurity from said polycrystalline semiconductor layer serving as a diffusion source into said semiconductor substrate to form a diffusion layer along said polycrystalline semiconductor layer, said diffusion layer together with said polycrystalline semiconductor layer defining an electrode region;

forming a supporting semiconductor layer on said dielectric layer;

removing said semiconductor substrate from a second major surface's side to expose a part of said dielectric layer, to thereby isolate said semiconductor substrate as well as said polycrystalline semiconductor layer by said dielectric layer for each of said semiconductor element forming regions; and forming an active layer on said diffusion layer, said active layer together with said electrode region forming a semiconductor element.

2. A method of fabricating a semiconductor device in accordance with claim 1, wherein said step of forming a supporting semiconductor layer includes a step of epitaxially growing said supporting layer.

3. A method of fabricating a semiconductor device in accordance with claim 1, wherein said step of removing includes a step of polishing said semiconductor substrate from said second major surface's side.

4. A method of fabricating a semiconductor device in accordance with claim 1, wherein said semiconductor element includes a bipolar transistor.

5. A method of fabricating a semiconductor device in accordance with claim 1, wherein said semiconductor element includes a field effect transistor.

* * * * *